(12) United States Patent
Luo et al.

(10) Patent No.: US 9,472,976 B2
(45) Date of Patent: Oct. 18, 2016

(54) STORAGE BATTERY DEVICE AND CHARGING CONTROL METHOD

(71) Applicant: NEC CORPORATION, Tokyo (JP)

(72) Inventors: Yuan Luo, Tokyo (JP); Kenichi Maruhashi, Tokyo (JP); Nobuhide Yoshida, Tokyo (JP); Shingo Takahashi, Tokyo (JP); Noriyuki Itabashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 162 days.

(21) Appl. No.: 14/366,698

(22) PCT Filed: Nov. 13, 2012

(86) PCT No.: PCT/JP2012/079333
§ 371 (c)(1),
(2) Date: Jun. 19, 2014

(87) PCT Pub. No.: WO2013/094344
PCT Pub. Date: Jun. 27, 2013

(65) Prior Publication Data
US 2015/0130404 A1    May 14, 2015

(30) Foreign Application Priority Data

Dec. 22, 2011  (JP) .................. 2011-281591

(51) Int. Cl.
*H02J 7/04* (2006.01)
*H02J 7/00* (2006.01)
(Continued)

(52) U.S. Cl.
CPC .............. *H02J 7/04* (2013.01); *H01M 10/441* (2013.01); *H01M 10/482* (2013.01);
(Continued)

(58) Field of Classification Search
CPC .................................................. Y02T 10/7011
USPC ......................................... 320/107, 115, 118
See application file for complete search history.

(56) References Cited

U.S. PATENT DOCUMENTS 6,366,057 B1 * 4/2002 Nakatsuji et al. .... H02J 7/0091
320/139
8,120,319 B2 * 2/2012 Nakatsuji et al. .... H02J 7/0016
320/115

(Continued)

FOREIGN PATENT DOCUMENTS

JP    10-253725    9/1998
JP    2001-268815    9/2001

(Continued)

OTHER PUBLICATIONS

International Search Report—PCT/JP2012/079333—Jan. 15, 2013.

(Continued)

*Primary Examiner* — Sun Lin
(74) *Attorney, Agent, or Firm* — Young & Thompson (57) ABSTRACT

Provided is a storage battery device whose battery life can be prolonged further. Storage battery device having a plurality of storage battery cells connected in series includes monitoring unit that measures voltages via the terminals of the respective storage battery cells, and obtains degradation information indicating the degraded states of the plurality of storage battery cells based on the voltages, selection unit that selects at least one of the plurality of storage battery cells, power supply unit that supplies power to the storage battery cell selected by selection unit to charge the storage battery cell, and control unit that switches, based on the degradation information obtained by monitoring unit, a storage battery cell to be selected by selection unit, and adjusts the power supplied from power supply unit.

20 Claims, 6 Drawing Sheets (51) Int. Cl.
*H01M 10/44* (2006.01)
*H01M 10/48* (2006.01)
*G01R 31/36* (2006.01)
*H01M 10/42* (2006.01)
*H01M 10/0525* (2010.01)

(52) U.S. Cl.
CPC .......... *H02J 7/0016* (2013.01); *H02J 7/0026* (2013.01); *G01R 31/362* (2013.01); *G01R 31/3658* (2013.01); *G01R 31/3679* (2013.01); *H01M 10/0525* (2013.01); *H01M 2010/4271* (2013.01); *Y02T 10/7011* (2013.01); *Y02T 10/7055* (2013.01)

(56) References Cited

U.S. PATENT DOCUMENTS 8,179,138 B2 * 5/2012 Chang et al. .......... H04N 17/04
324/404

| | | | |
|---|---|---|---|
| 2010/0019725 A1 | 1/2010 | Nakatsuji | |
| 2014/0203654 A1* | 7/2014 | Takahashi et al. ....... | H02J 1/00 307/82 |

FOREIGN PATENT DOCUMENTS

| | | |
|---|---|---|
| JP | 2004-215322 | 7/2004 |
| JP | 2005-224024 | 8/2005 |
| JP | 2007-053828 | 3/2007 |
| JP | 2009-055687 | 3/2009 |
| JP | 2009-247145 | 10/2009 |
| JP | 2010-083178 | 4/2010 |
| JP | 2010-097760 | 4/2010 |
| JP | 2010-124634 | 6/2010 |
| JP | 2011-155774 | 8/2011 |

OTHER PUBLICATIONS

European Search Report—EP 12 85 9273—Jul. 21, 2015.

* cited by examiner

STORAGE BATTERY DEVICE AND CHARGING CONTROL METHOD

TECHNICAL FIELD

The present invention relates to a storage battery device that includes a plurality of storage battery cells connected in series.

BACKGROUND ART

Recently, the storage battery devices including a lithium ion storage batteries or the like has been used in many situations. For example, a storage battery device is used as the driving source for an electric car, used for peak cutting carried out to reduce power consumption at the time period of great power demand on a demand side such as a household, a store, or a commercial establishment, used for load shifting carried out to consume power at the time period of small power demand on the demand side, or used for stabilizing unstable renewable energy outputting on a system side such as a power company or a heavy electric machinery company. In the storage battery device used for any of such purposes, a storage battery device that has a large capacity is necessary. The storage battery device of the large capacity can be achieved by connecting a plurality of storage battery cells in series.

Characteristics of a storage battery, such as effective power storage amount, are known to greatly deteriorate due to natural discharging, long-time use, or a charging/discharging cycle. Storage battery cells included in the storage battery does not degrade evenly each cell. Therefore, in the storage battery, storage battery cells that have undergone capacity degradation and storage battery cells which have not undergone capacity degradation are frequently mixed. In such a case, the overall characteristics of the storage battery are determined by the characteristics of the storage battery cells which have undergone capacity degradation.

Under these circumstances, a storage battery device that equally uses storage battery cells for the purpose of preventing shortening of a life has been offered (refer to Patent Literatures 1 and 2).

Patent Literature 1 describes a power supply system that outputs a voltage from each of a plurality of storage battery cells connected in series.

Figure 1:
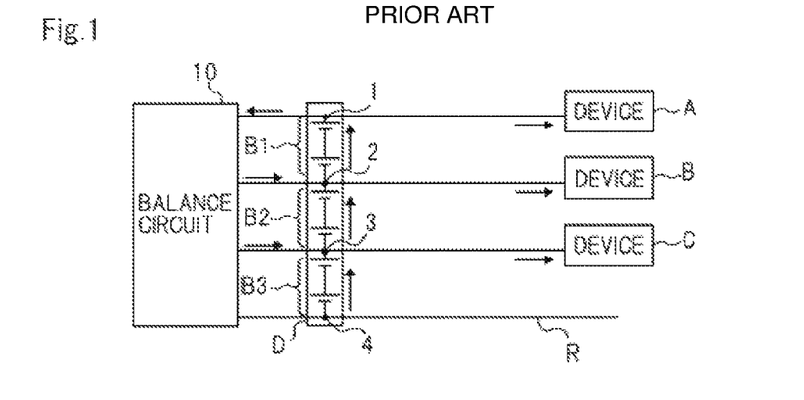
FIG. 1 A circuit diagram illustrating a power supply system described in Patent Literature 1.

FIG. 1 is a circuit diagram illustrating the power supply system described in Patent Literature 1.

In FIG. 1, storage battery D includes storage battery cells B1, B2, and B3 connected in series.

Device A is connected to terminal 1, device B is connected to terminal 2, device C is connected to terminal 3, and return wire R is connected to terminal 4. Devices A, B, and C are activated by power discharged from storage battery D. Balance circuit 10 is connected to terminals 1 to 4. The output voltages of storage battery cells B1 to B3 are made uniform by exchanging energy among storage battery cells B1 to B3.

In a power supply system configured by removing balance circuit 10 from the power supply system illustrated in FIG. 1, usually, currents flowing through storage battery cells B1 to B3 are not uniform, and the output voltages of the storage battery cells are not uniform.

Figure 2:
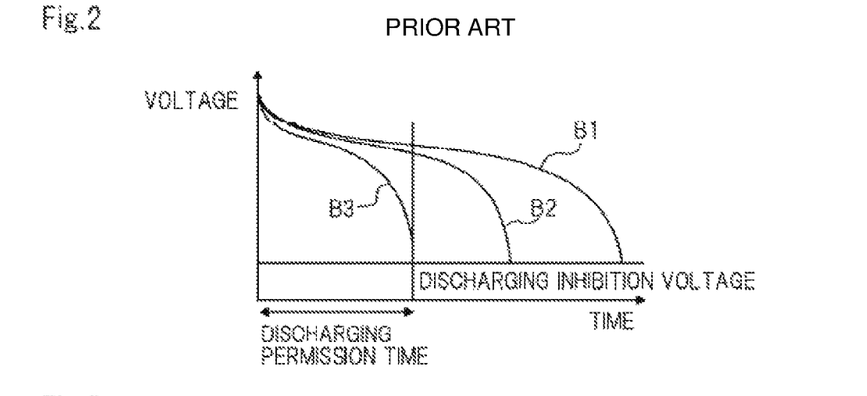
FIG. 2 A graph illustrating the changes of output voltages when power is discharged from a storage battery in a power supply system configured by removing a balance circuit from the power supply system illustrated in FIG. 1.

FIG. 2 is a graph illustrating the changes of the output voltages of storage battery cells B1 to B3 when power is discharged from storage battery D from an initial state where storage battery cells B1 to B3 are fully charged in the power supply system configured by removing balance circuit 10 from the power supply system illustrated in FIG. 1.

Figure 3:
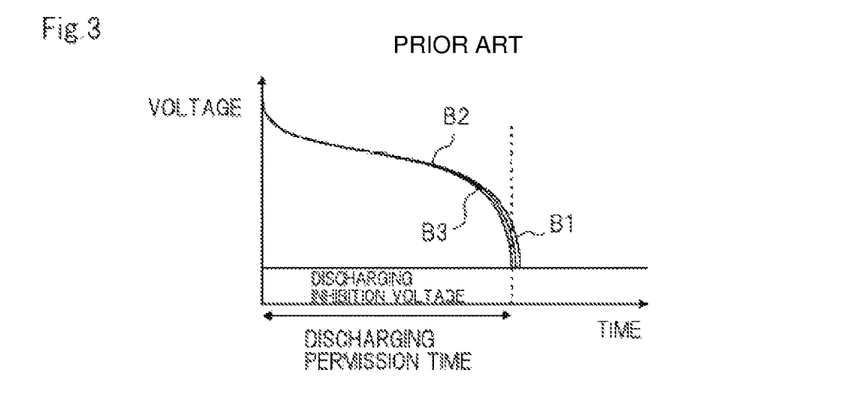
FIG. 3 A graph illustrating the changes of output voltages when power is discharged from a storage battery in the power supply system illustrated in FIG. 1.

FIG. 3 is a graph illustrating the changes of the output voltages of storage battery cells B1 to B3 when power is discharged from storage battery D from an initial state where storage battery cells B1 to B3 are fully charged in the power supply system illustrated in FIG. 1.

The changes of the output voltages of storage battery cells B1 to B3 illustrated in FIG. 2 are different from one another, while the changes of the output voltages of storage battery cells B1 to B3 illustrated in FIG. 3 are similar.

Discharging permission time illustrated in FIGS. 2 and 3 represents time from a discharging start to a discharging inhibition voltage of, among storage battery cells B1 to B3, storage battery cell B3 the output voltage of which reaches the discharging inhibition voltage shortest in time from the discharging start. The discharging permission time illustrated in FIG. 2 is longer than that illustrated in FIG. 3.

Patent Literature 2 discloses a charging/discharging control circuit that causes, when a storage battery including a plurality of storage battery cells connected in series is charged or discharged, the output voltages of the storage battery cells to become uniform.

Figure 4:
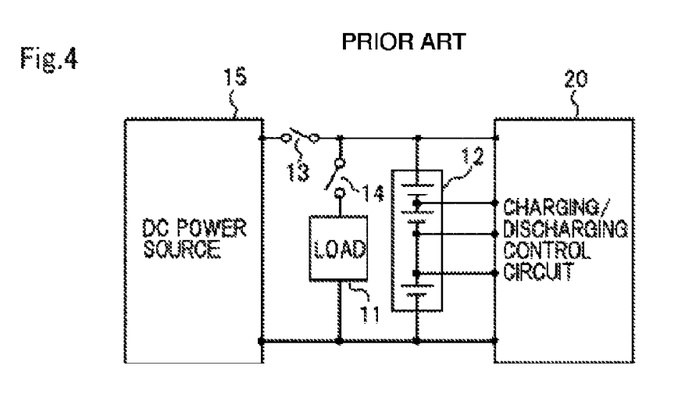
FIG. 4 A block diagram illustrating a device that includes a charging/discharging control circuit described in Patent Literature 2.

FIG. 4 is a block diagram illustrating a device that includes the charging/discharging control circuit described in Patent Literature 2.

In the device illustrated in FIG. 4, when switch 13 is ON while switch 14 is OFF, charging/discharging control circuit 20 charges storage battery 12 by using DC power source 15. When switch 14 is ON while switch 13 is OFF, power is charged from storage battery 12, and the discharged power is consumed by load 11.

Charging/discharging control circuit 20 illustrated in FIG. 4 compares the output voltage of each storage battery cell with the average among of the output voltages of all the storage battery cells. Then, charging/discharging control circuit 20 switches switches 13 and 14 ON/OFF according to the result of the comparison, divides some of currents discharged from the respective storage battery cells to flow into charging/discharging control circuit 20, thereby causing the output voltages of the storage battery cells to become uniform.

Thus, by causing the output voltages of the storage battery cells to become uniform, rapid degradation of storage battery cells that have undergone capacity degradation is prevented and the battery life of storage battery 12 as a whole can be prolonged.

CITATION LIST

Patent Literature 1: JP2009-247145A
Patent Literature 2: JP2004-215322A

SUMMARY OF INVENTION

Problems to be Solved

In the technologies described in Patent Literatures 1 and 2, the output voltages of the storage battery cells are made uniform by using the balance circuit or the average voltage holding circuit. In this case, however, since storage battery cells, whose capacity is partially degraded, are used in the same manner as more degraded storage battery cells, the storage battery cells that are partially degraded cannot be fully used. The life of the storage battery device is determined according to the lives of the more degraded storage battery cells. As a result, the life of the storage battery device cannot be sufficiently prolonged.

It is therefore an object of the present invention to provide a storage battery device and a charging control method capable of prolonging battery life further.

Solution to Problem

According to the present invention, a storage battery device includes a plurality of storage battery cells connected in series, a monitoring unit that measures voltages via the terminals of the respective storage battery cells, and obtains degradation information indicating the degraded states of the plurality of storage battery cells based on the voltages, a selection unit that selects at least one cell from among a plurality of storage battery cells, a power supply unit that supplies power to the storage battery cell selected by the selection unit to charge the storage battery cell, and a control unit that switches, based on the degradation information obtained by the monitoring unit, a storage battery cell to be selected by the selection unit, and adjusts the power supplied from the power supply unit.

According to the present invention, a charging control method implemented in a storage battery device that includes a plurality of storage battery cells connected in series, includes measuring voltages via the terminals of the respective storage battery cells, obtaining degradation information indicating the degraded states of the plurality of storage battery cells based on the voltages, selecting at least one cell from among a plurality of storage battery cells, supplying power to the storage battery cell selected in the selection step to charge the storage battery cell, switching, based on the obtained degradation information, a storage battery cell to be selected, and adjusting the power supplied in the power supply step.

Effects of Invention

According to the present invention, battery life can be prolonged further.

DESCRIPTION OF EMBODIMENTS

Hereinafter, the embodiments of the present invention will be described with reference to the drawings. In the description below, components having similar functions will be denoted by similar reference numerals, and description thereof may be omitted.

First Embodiment

Figure 5:
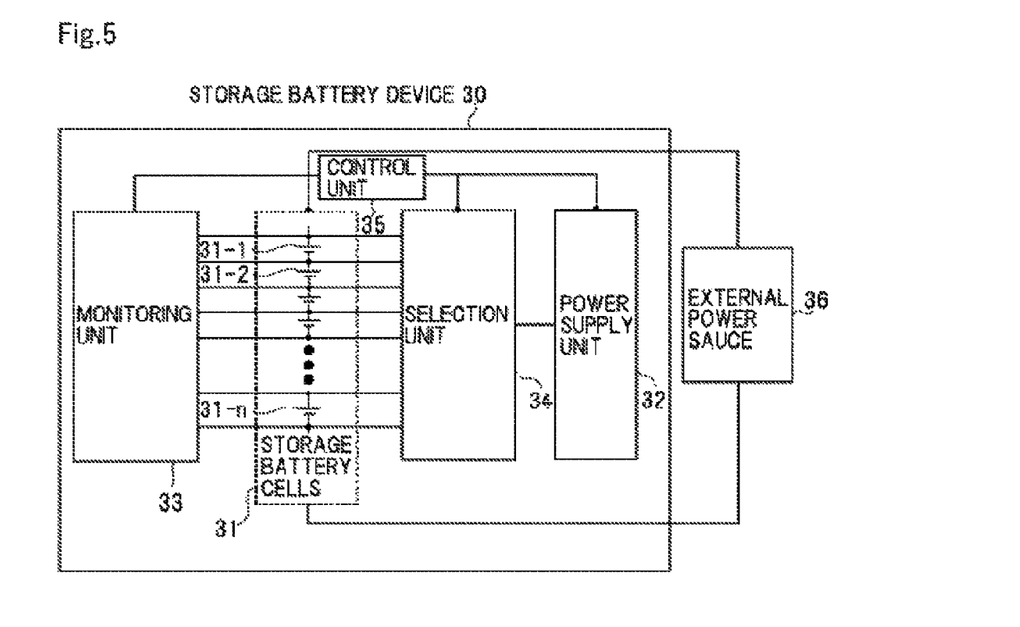
FIG. 5 A block diagram illustrating the configuration of a storage battery device according to the first embodiment of the present invention.

FIG. 5 is a block diagram illustrating the configuration of a storage battery device according to the embodiment.

Storage battery device 30 illustrated in FIG. 5 includes serial cell 31, power supply unit 32, monitoring unit 33, selection unit 34, and control unit 35. Storage battery device 30 is connectable to external power source 36. FIG. 5 illustrates storage battery device 30 connected to external power source 36.

Serial cell 31 includes a plurality of storage battery cells 31-1 to 31-$n$ connected in series, and intermediate tap terminals drawn from the positive terminals of respective storage battery cells 31-2 to 31-$n$. Here, n is an integer of 2 or higher. Serial cell 31 includes the positive terminal of storage battery cell 31-1 and the negative terminal of storage battery cell 31-$n$ as the positive terminal and the negative terminal of serial cell 31.

Storage battery cells 31-1 to 31-$n$ are preferably lithium ion storage battery cells.

External power source 36 is connected to the positive terminal and the negative terminal of serial cell 31 to supply power to storage battery device 30.

In storage battery device 30, external power source 36 charges serial cell 31. At this time, when there is no degradation of storage battery cells 31-1 to 31-$n$, the charged states of the storage battery cells are uniform.

Selection unit 34 is connected to the positive terminal, the negative terminal, and the intermediate tap terminal of serial cell 31. Selection unit 34 is connected to power supply unit 32.

Selection unit 34 receives, from control unit 35, a control signal for selecting at least one cell from among storage battery cells 31-1 to 31-$n$, and selects at least one cell from among storage battery cells 31-$n$ to 31-$n$ according to the control signal.

Figure 6:
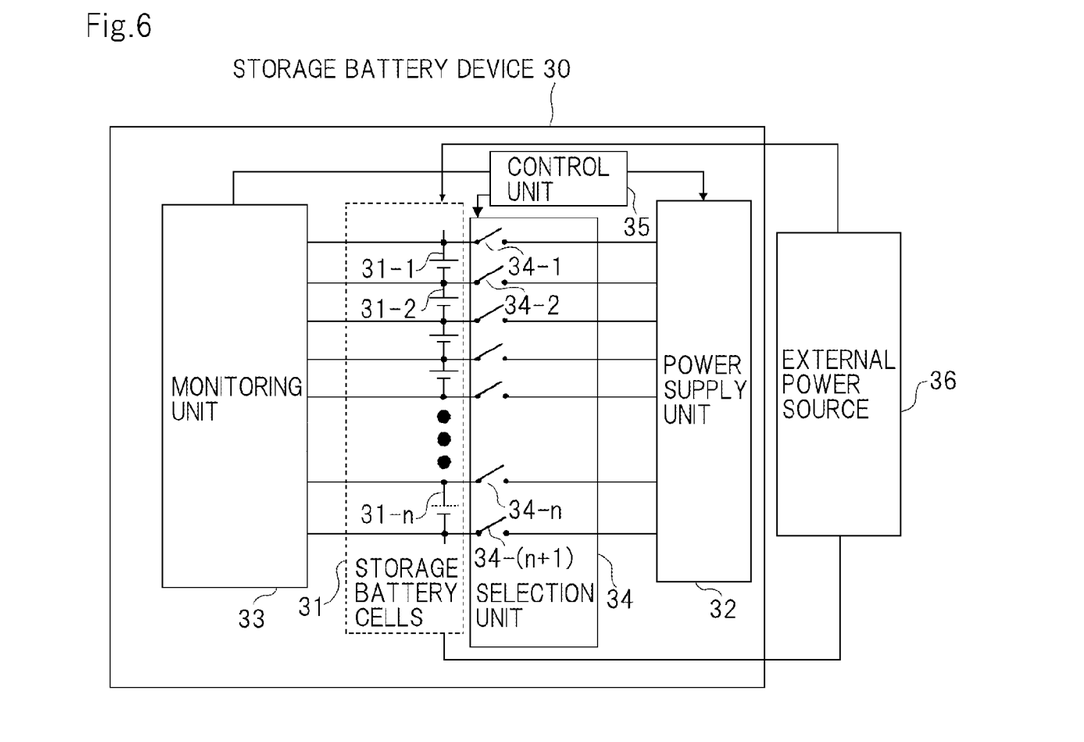
FIG. 6 A block diagram illustrating the configuration of the storage battery device that uses a (n+1) terminal pair circuit as a selection unit.

FIG. 6 is a block diagram illustrating the configuration of storage battery device 30 that uses a (n+1) terminal pair circuit as an example of selection unit 34. In FIG. 6, the (n+1) terminal pair circuit that is selection unit 34 includes (n+1) switches 34-1 to 34-($n$+1) arranged on wiring for connecting power supply unit 32 to the positive terminal, the negative terminal, and the intermediate tap terminal of serial cell 31. Here, selection unit 34 switches switches ON/OFF 34-1 to 34-($n$+1) so that a voltage can be supplied from power supply unit 32 to a selected storage battery cell.

Power supply unit 32 receives, from control unit 35, a power supply signal indicating an applied voltage to be applied to the storage battery cell selected by selection unit 34, and applies the applied voltage indicated by the power supply signal to the storage battery cell selected by selection unit 34 to charge the storage battery cell.

Monitoring unit 33 is connected to each terminal of serial cell 31. Monitoring unit 33 obtains degradation information indicating the degraded state of each of storage battery cells 31-1 to 31-$n$ via each terminal, and transmits the degradation information to control unit 35.

The degraded state of the storage battery cell is a parameter referred to as SOH (State of Health). As the SOH, for example, one value selected from among an output voltage (specifically, voltage between terminals of storage battery cells), internal impedance, a battery residual amount, a charging rate and an effective power storage amount, or a combination thereof is employed.

Control unit 35, which has received the degradation information from monitoring unit 33, selects at least one cell from among storage battery cells 31-1 to 31-$n$ based on the degradation information, and determines an applied voltage to be applied to the storage battery cell.

The applied voltage may be a DC voltage or a pulse voltage. When the applied voltage is a DC voltage, control unit 35 adjusts the value of the DC voltage based on the degradation information. When the applied voltage is a pulse-like voltage, control unit 35 adjusts the duty ratio of the pulse-like voltage based on the degradation information.

Here, control unit 35 increases the charging amount of the storage battery cell by setting the value of the DC voltage or the duty ratio of the pulse voltage higher as the degradation of the storage battery cell becomes smaller.

Control unit 35 transmits a selection signal indicating the selected storage battery cell to selection unit 34, transmits a power supply signal indicating the determined applied voltage to power supply unit 32, switches a storage battery cell to be selected by selection unit 34, and adjusts power supplied from power supply unit 32.

Hereinafter, the operation of storage battery device 30 will be described.

Figure 7:
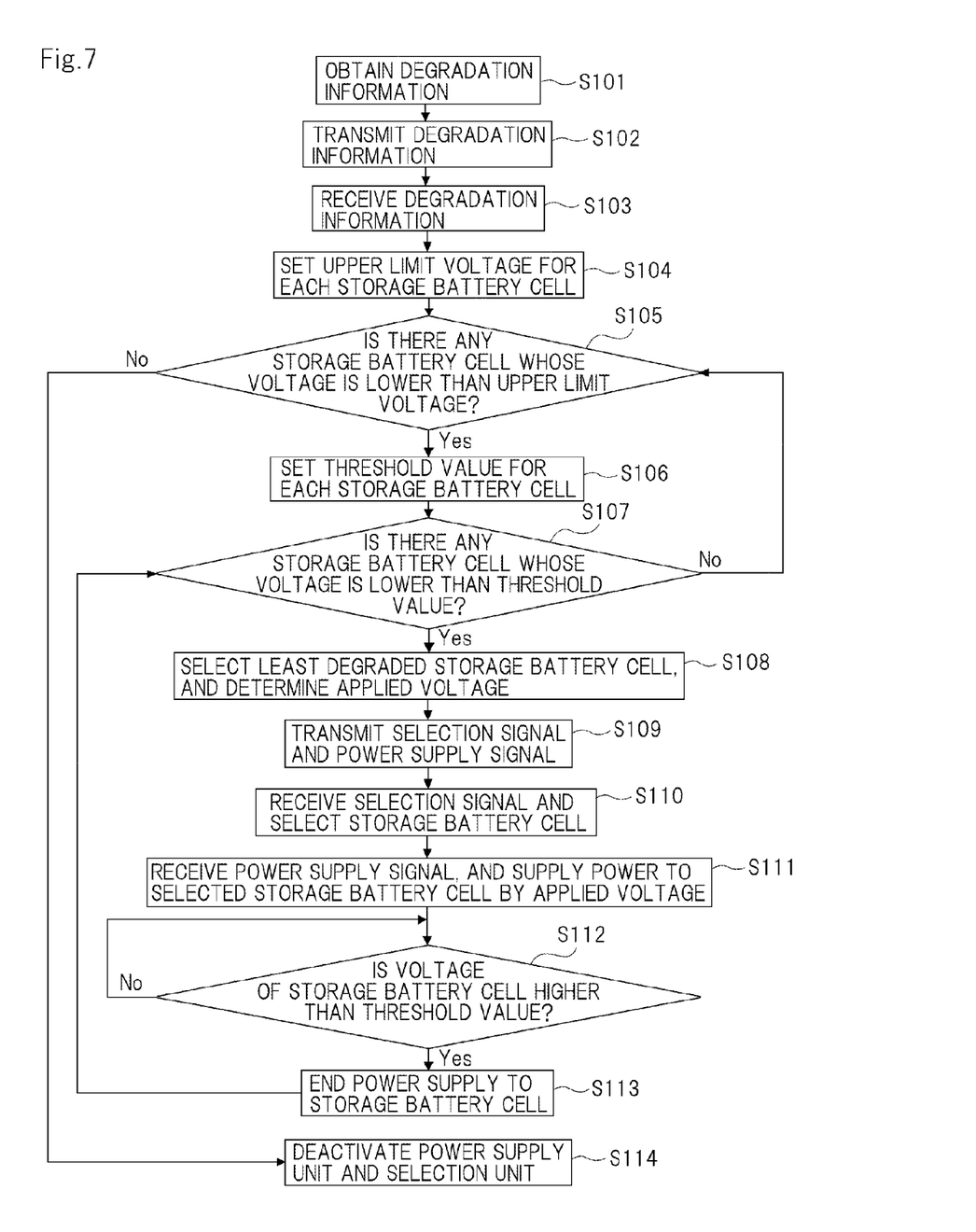
FIG. 7 A flowchart illustrating the example of the operation of the storage battery device according to the first embodiment of the present invention.

FIG. 7 is a flowchart illustrating the example of an operation when storage battery device 30 is charged from external power source 36.

After external power source 36 has been connected to storage battery device 30, monitoring unit 33 of storage battery device 30 continuously obtains the degradation information of respective storage battery cells 31-1 to 31-$n$ (step S101). Here, the degradation information indicates the effective capacity and an output voltage.

Monitoring unit 33 continuously transmits the obtained degradation information to control unit 35 (step S102).

Control unit 35 receives the degradation information from monitoring unit 33 (step S103).

Control unit 35 sets, based on the effective capacity of storage battery indicated by the received degradation information, an upper limit voltage that is a voltage when power supply unit 32 ends the charging for each storage battery cell (step S104). For example, control unit 35 sets the upper limit voltage such that the larger the effective capacity of the storage battery cell the higher is the upper limit voltage.

Control unit 35 determines whether there is any storage battery cell having a current output voltage set lower than the upper limit voltage based on the received degradation information (step S105).

When there is no storage battery cell having a current output voltage set lower than the upper limit voltage, control unit 35 transmits a power supply stop signal to power supply unit 32 to stop application of the applied voltage, and transmits a selection stop signal to selection unit 34 to end selection of the storage battery cell (step S114).

When there is a storage battery cell having a current output voltage set lower than the upper limit voltage, control unit 35 sets a threshold value for each storage battery cell based on a stored counter value (step S106). Control unit 35 increments the counter value each time it is determined in step S105 so that the storage battery will have an output value that is set lower than the upper limit voltage. Control unit 35, which has incremented the counter value, increases the threshold value to set the value. After the counter value has reached a predetermined value, control unit 35 sets the threshold value to a value equal to the upper limit voltage.

Control unit 35 determines whether there is any storage battery cell having a current output voltage set lower than the threshold value (step S107).

When there is no storage battery cell having a current output voltage set lower than the threshold value, control unit 35 returns to step S105.

When there are storage battery cells having current output voltages set lower than the threshold value, control unit 35 selects, among the storage battery cells having current output voltages set lower than the threshold value, a storage battery cell that has the largest effective capacity, as a storage battery with the smallest capacity degradation based on the received degradation information. Further, control unit 35 determines an applied voltage based on the degradation information (step S108).

Control unit 35 transmits to selection unit 34 a selection signal indicating the selected storage battery cell, and transmits to power supply unit 32 a power supply signal indicating the determined applied voltage (step S109).

Selection unit 34 receives the selection signal transmitted in step S109, and selects the storage battery cell indicated by the selection signal (step S110).

Power supply unit 32 receives the power supply signal transmitted in step S109, and applies the applied voltage indicated by the power supply signal to the storage battery cell selected by selection unit 34 to charge the storage battery cell (step S111).

Control unit 35 determines whether the current output voltage of the storage battery cell charged by power supply unit 32 is higher than the threshold value based on the degradation information (step S112).

When the current output voltage of the storage battery cell charged by power supply unit 32 is not higher than the threshold value, control unit 35 returns to step S112.

When the current output voltage of the storage battery cell charged by power supply unit 32 is higher than the threshold value, control unit 35 returns to step S107.

In the aforementioned operation, the storage battery cell whose capacity is partially degraded is charged before its capacity is further degraded and charged until a threshold that is higher than that the value of the storage battery cells whose capacity has been degraded is reached. This processing is repeated with the increase of the threshold, and eventually a voltage when charging of the storage battery cell, whose capacity has been partially degraded, ends is higher than the voltage that occurs when charging of storage battery cell, whose capacity has been completed degraded, ends.

Hereinafter, the change of the SOH of storage battery device 30 according to the first embodiment of the present invention will be described.

Here, an effective power storage amount is employed as the SOH. The effective capacity of the storage battery is a ratio of a power storage amount at the current fully-charged time of the storage battery to that at the fully-charged time in the initial state of the storage battery. Hereinafter, the effective capacity of the storage battery will be represented by a percentage unit. The number n of storage battery cells is 2.

Figure 8:
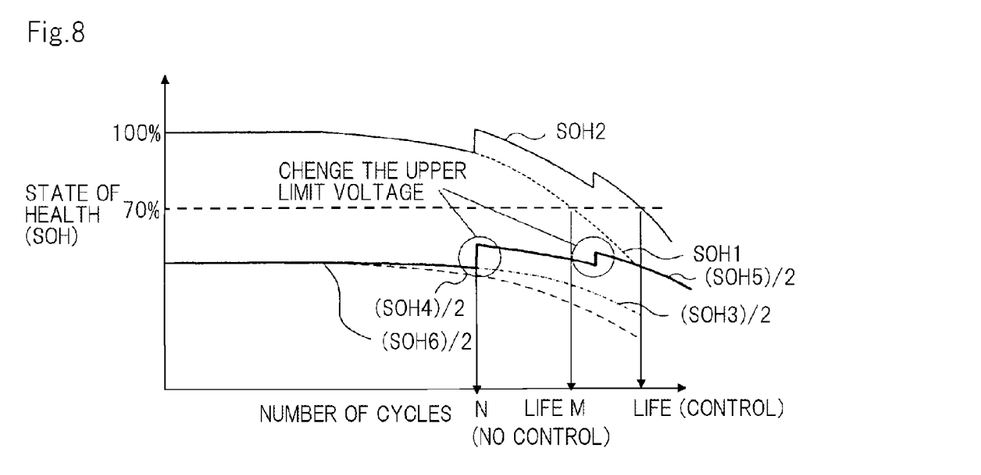
FIG. 8 A graph illustrating a relationship between the number of cycles and SOH at a comparison storage battery and the storage battery device according to the first embodiment of the present invention.

FIG. 8 is a graph illustrating a relationship between SOH at a comparison storage battery device that includes two storage battery cells connected in series, storage battery device 30, and each storage battery cell and the number of cycles indicating the number of charging/discharging times.

Hereinafter, the SOH of the comparison storage battery device is SOH 1, the SOH of storage battery device 30 is SOH 2, the SOHs of the two storage battery cells of the comparison storage battery device are respectively SOH 3 and SOH 4, the SOH of storage battery cell 31-1 is SOH 5, and the SOH of storage battery cell 31-2 is SOH 6.

The number of cycles when SOH is 70% indicates the end of cycle life of the comparison storage battery device and storage battery device 30.

When the storage battery cells are in initial states, SOH 3, SOH 4, SOH 5, and SOH 6 are all 100%. Accordingly, SOH 1 and SOH 2 are also 100% in initial states.

In the case of the comparison storage battery, it is assumed that after the number of cycles M has been passed, the storage battery cells deteriorate due to the passage of time or charging/discharging, SOH 3 is 80%, and SOH 4 is 60%.

Here, SOH 1 is 70% that is an average value of SOH 3 and SOH 4. Accordingly, the end of cycle life of the comparison battery is when the number of cycles is M.

On the other hand, in the case of storage battery device 30, the upper limit voltage is set beforehand to be higher in step S104 illustrated in FIG. 7 when the number of cycles N smaller than the number of cycles M is reached. Accordingly, SOH 5 increases.

Here, it is assumed that when the number of cycles M is reached, SOH 5 is 90%, which is larger than 80% of SOH 3, and SOH 6 is 60%, which is equal to that of SOH 4.

In this case, after the number of cycles M has been passed, SOH 2 is 75%, which is larger than 70% of SOH 1, and storage battery device 30 is yet to reach its life end. Thus, the life of storage battery device 30 can be longer than that of the comparison storage battery device.

As described above, according to the embodiment, storage battery device 30 includes the plurality of storage battery cells connected in series, monitoring unit 33 that measures voltages via the terminals of the respective storage battery cells, and that obtains degradation information indicating the degraded states cell from among the plurality of storage battery cells based on the voltages, selection unit 34 that selects at least one of the plurality of storage battery cells, power supply unit 32 that supplies power to the storage battery cell selected by selection unit 34 to charge the storage battery cell, and control unit 35 that switches, based on the degradation information obtained by monitoring unit 33, a storage battery cell to be selected by selection unit 34, and adjusts the power supplied from power supply unit 32. Thus, batter life can be prolonged further.

According to the embodiment, in storage battery device 30, a voltage when power supply unit 32 performs charging is a DC voltage, and control unit 35 adjusts the value of the DC voltage based on the degradation information. Thus, the storage battery cell selected by selection unit 34 can be charged by a constant voltage according to the degree of degradation.

According to the embodiment, in storage battery device 30, control unit 35 sets the value of the DC voltage higher because degradation of the storage battery cell selected by selection unit 34 is smaller based on the degradation information. Thus, a voltage when charging of a partially degraded storage battery cell ends can be set higher.

According to the embodiment, in storage battery device 30, a voltage when power supply unit 32 performs charging is a pulse voltage, and control unit 35 adjusts the duty ratio of the pulse voltage based on the degradation information. Thus, the selected storage battery cell can be subjected to pulse charging according to the degree of degradation.

According to the embodiment, in storage battery device 30, a voltage when power supply unit 32 performs charging is a pulse voltage, and control unit 35 adjusts the duty ratio of the pulse voltage based on the degradation information. Thus, a voltage when charging of a partially degraded storage battery cell ends can be set higher at a high speed.

Second Embodiment

Figure 9:
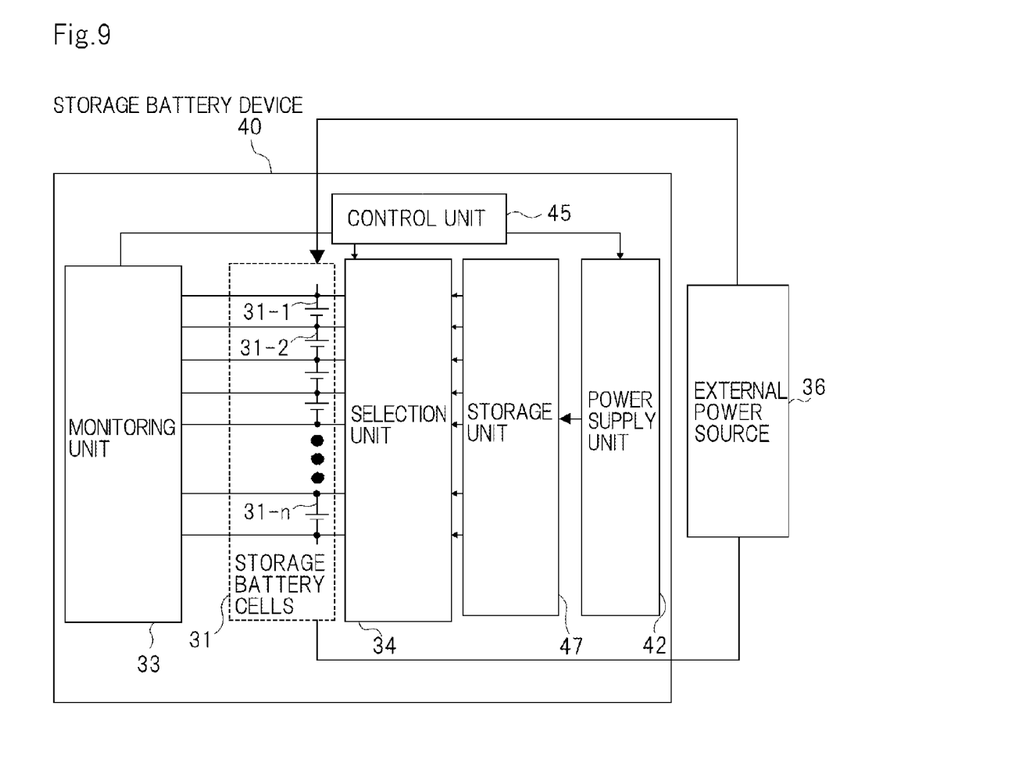
FIG. 9 A block diagram illustrating the configuration of a storage battery device according to the second embodiment of the present invention.

FIG. 9 is a block diagram illustrating the configuration of a storage battery device according to the embodiment.

Storage battery device 40 illustrated in FIG. 9 includes serial cell 31, power supply unit 42, monitoring unit 33, selection unit 34, control unit 45, and storage unit 47. Storage battery device 40 is connected to external power source 36.

Differences from the configuration of the first embodiment illustrated in FIG. 5 are that power supply unit 42 is connected to storage unit 47, and storage unit 47 is connected to power supply unit 42 and selection unit 34 and connected to a storage battery cell selected by selection unit 34 via selection unit 34.

Power supply unit 42 receives, from control unit 45, a power supply signal indicating an applied voltage to be applied to storage unit 47, and applies the applied voltage indicated by the power supply signal to storage unit 47, thereby supplying power to storage unit 47.

Storage unit 47, to which the power has been supplied from power supply unit 42, transfers power with the storage battery cell selected by selection unit 34 to temporarily store the power. Storage unit 47 is preferably one selected from among a storage battery cell and a storage battery.

Control unit 45, which has received degradation information from monitoring unit 33, selects at least one cell from among of storage battery cells 31-1 to 31-$n$ to transfer power with storage unit 47 based on the degradation information, and determines an applied voltage to be applied to storage unit 47 by power supply unit 42. Control unit 45 transmits to selection unit 34 a selection signal indicating the selected storage battery cell to selection unit 34, and transmits to power supply unit 42 a power supply signal indicating the determined applied voltage.

Control unit 45 switches, based on the degradation information, a storage battery cell to be selected by selection unit 34 so that among the plurality of storage battery cells, power can be supplied from a first storage battery cell to storage unit 47 and power can be supplied from storage unit 47 to a second storage battery cell smaller in degradation than the first storage battery cell.

The embodiment is different from the first embodiment in that storage unit 47 temporarily stores the power to transfer the power of storage battery cell whose capacity has been degraded to a storage battery cell whose capacity is only partially degraded, thereby increasing the power of the storage battery cell limited in degradation.

Hereinafter, the operation of storage battery device 40 illustrated in FIG. 9 will be described.

Figure 10:
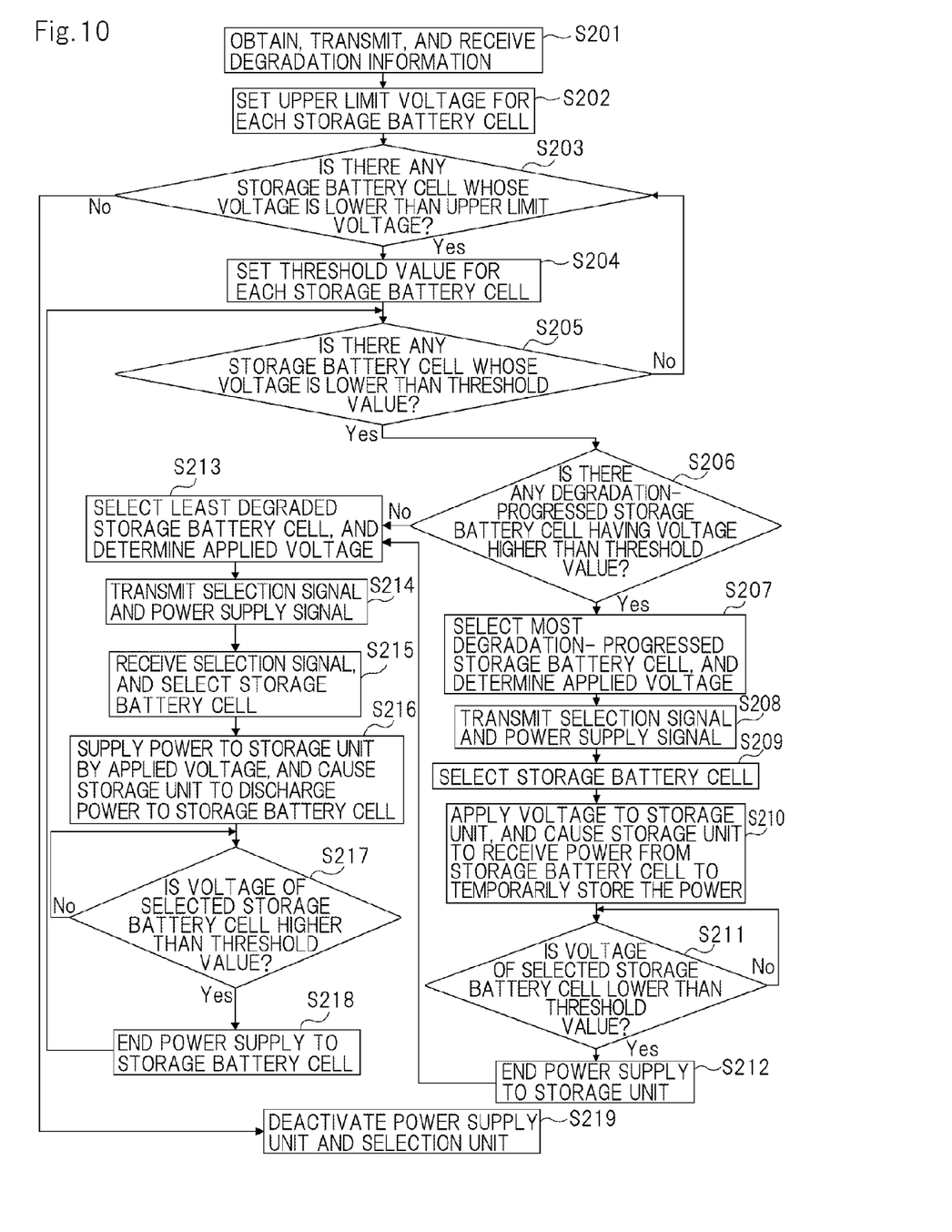
FIG. 10 A flowchart illustrating the example of the operation of the storage battery device according to the second embodiment of the present invention.

FIG. 10 is a flowchart illustrating an operation when storage battery device 40 is charged from external power source 36.

Monitoring unit 33 continuously obtains the degradation information of storage battery cells 31-1 to 31-$n$. Monitoring unit 33 continuously transmits the obtained degradation information to control unit 45. Control unit 45 receives the degradation information from monitoring unit 33 (step S201).

Control unit 45 sets, based on an effective capacity indicated by the received degradation information, an upper limit voltage that is a voltage when power supply unit 42 ends the charging for each storage battery cell (step S202). For example, control unit 45 sets the upper limit voltage such that the larger the effective capacity of the storage battery the higher is the upper limit voltage.

Control unit 45 determines whether there is any storage battery cell having a current output voltage set lower than the upper limit voltage based on the received degradation information (step S203).

When there is no storage battery cell having a current output voltage set lower than the upper limit voltage, control unit 45 transmits a power supply stop signal to power supply unit 42 to stop application of the applied voltage, and transmits a selection stop signal to selection unit 34 to end selection of the storage battery cell (step S219).

When there is a storage battery cell having a current output voltage set lower than the upper limit voltage, control unit 45 sets a threshold value for each storage battery cell based on a stored counter value (step S204). Control unit 45 increments the counter value each time it is determined in step S203 that there is a storage battery cell having an output voltage set lower than the upper limit voltage. Control unit 45, which has incremented the counter value, increases the threshold value to set the value. After the counter value has reached a predetermined value, control unit 45 sets the threshold value to a value equal to the upper limit voltage.

Control unit 45 determines whether there is any storage battery cell having a current output voltage set lower than the threshold value (step S205).

When there is no storage battery cell having a current output voltage set lower than the threshold value, control unit 45 returns to step S203.

When there are storage battery cells having current output voltages set lower than the threshold value, control unit 45 determines whether there is a storage battery cells whose capacity is partially degraded based on the deterioration information, when among the storage battery cells having current output voltages set higher than the threshold value, a storage battery cell having an effective power storage amount smaller than those of all the storage battery cells having current output voltages set lower than the threshold value is a storage battery cell whose capacity is degraded (step S206).

When there is not a storage battery cell whose capacity has been degraded from among the storage battery cells having current output voltages set higher than the threshold value, the processing proceeds to step S213.

When there are degradation progressed storage battery cells among the storage battery cells having current output voltages set higher than the threshold value, control unit 45 selects a storage battery cell having the smallest effective capacity from among storage battery cells whose capacity has been degraded, as the storage battery cell whose capacity has become the most degraded, and determines an applied voltage to be applied to storage unit 47 by power supply unit 42 based on the degradation information (step S207).

Control unit 45 transmits to selection unit 34 a selection signal indicating the selected storage battery cell, and transmits to power supply unit 42 a power supply signal indicating the determined applied voltage (step S208).

Selection unit 34 receives the selection signal transmitted in step S208, and selects the storage battery cell indicated by the selection signal (step S209).

Power supply unit 42 receives the power supply signal transmitted in step S208, and applies the applied voltage indicated by the power supply signal to storage unit 47 to supply power. Storage unit 47 receives power from the storage battery cell selected by selection unit 34 to temporarily store the power (step S210). In step S210, the voltage applied to storage unit 47 by power supply unit 42 also functions to control the transfer of the power from the storage battery cell selected by selection unit 34 to storage unit 47.

Control unit 45 determines whether the voltage of the storage battery cell selected by selection unit 34 is lower than the threshold value of the storage battery cell (step S211).

When the current voltage of the storage battery cell selected by selection unit 34 is not lower than the threshold value, control unit 45 returns to step S211.

When the current voltage of the storage battery cell selected by selection unit 34 is lower than the threshold value, control unit 45 transmits a power supply stop signal to power supply unit 42 to stop application of the applied voltage, and ends supplying of the power to storage unit 47 (step S212).

Control unit 45 selects, based on the degradation information, a storage battery cell having a largest effective power storage amount among the storage battery cells having current voltages set lower than the threshold value as a least degraded storage battery cell, and determines an applied voltage to be applied to storage unit 47 based on the degradation information (step S213).

Control unit 45 transmits to selection unit 34 a selection signal indicating the selected storage battery cell, and transmits to power supply unit 42 a power supply signal indicating the determined applied voltage (step S214).

Selection unit 34 receives the selection signal transmitted in step S214, and selects the storage battery cell indicated by the selection signal (step S215).

Power supply unit 42 receives the power supply signal transmitted in step S214, and applies the applied voltage indicated by the power supply signal to storage unit 47 to supply power. Storage unit 47 temporarily stores the power. Storage unit 47 discharges, via selection unit 34, the power temporarily stored thus far in the storage battery cell selected by selection unit 34 (step S216).

Control unit 45 determines whether the current voltage of the storage battery cell selected by selection unit 34 is higher than the threshold value (step S217).

When the current voltage of the storage battery cell selected by selection unit 34 is not higher than the threshold value, control unit 45 returns to step S217.

When the current voltage of the storage battery cell selected by selection unit 34 is higher than the threshold value, control unit 45 transmits a power supply stop signal to power supply unit 42 to end supplying of the power to storage unit 47 (step S218).

After the end of step S218, control unit 45 returns to step S205.

In the flowchart illustrated in FIG. 10, storage unit 47 temporarily stores the power from the degraded storage battery cell and power supply unit 42, and then the power is supplied to the storage battery cell limited in degradation from storage unit 47. Accordingly, the storage battery cell whose capacity has been partially degraded is charged before there is further capacity degradation of the cell, and charged until a threshold value that is higher than that of the degraded storage battery cell is reached. This processing is repeated with the increase of the threshold value, and eventually a voltage when the charging of the storage battery cell limited in degradation ends is higher than that of the degradation progressed storage battery cell.

As described above, according to the embodiment, storage battery device 40 further includes storage unit 47 that transfers power with the storage battery cell selected by selection unit 34 to store the transferred power. Control unit 45 switches, based on the degradation information, a storage battery cell to be selected by selection unit 34 so that from among the plurality of storage battery cells, power can be supplied from a first storage battery cell to storage unit 47 and power can be supplied from storage unit 47 to a second storage battery cell smaller in degradation than the first storage battery cell. As a result, battery life can be prolonged more, and the charged states of the storage battery cells of serial cell 31 can be balanced.

According to the embodiment, even when power supply unit 42 is connected to selection unit 34, without interposing storage unit 47, and connected, via selection unit 34, to the storage battery cell selected by selection unit 34, similar effects can be provided if similar operations are performed.

The preferred embodiments of the present invention have been described. However, the present invention is not limited to the embodiments. Various changes can be made without departing from the gist of the invention.

This application claims priority from Japanese Patent Application No. 2011-281591 filed Dec. 22, 2011, which is hereby incorporated by reference herein in its entirety.

REFERENCE NUMERALS

30 Storage battery device
31 Serial cell
31-1 to 31-*n* Storage battery cell
32 Power supply unit
33 Monitoring unit
34 Selection unit
34-1 to 34-*n* Switch
35 Control unit
36 External power source
40 Storage battery device
42 Power supply unit
45 Control unit
47 Storage unit

What is claimed is:

1. A storage battery device comprising:
a plurality of storage battery cells connected in series;
a monitoring unit that measures voltages of the plurality of storage battery cells via terminals associated with each storage battery cell, and obtains degradation information indicating degraded states of the plurality of storage battery cells based on the voltages;
a selection unit that selects, using associated pairs of switches, at least one storage battery cell from among the plurality of storage battery cells;
a power supply unit that supplies power to the at least one storage battery cell selected by the selection unit to charge said at least one storage battery cell; and
a control unit that switches, based on the degradation information obtained by the monitoring unit, a storage battery cell to be selected by the selection unit, and adjusts the power supplied from the power supply unit.

2. The storage battery device according to claim 1, wherein:
a voltage when the power supply unit performs charging is a DC voltage; and
the control unit adjusts a value of the DC voltage based on the degradation information.

3. The storage battery device according to claim 2, wherein the control unit sets the value of the DC voltage to a higher level when capacity degradation of the storage battery cell selected by the selection unit becomes smaller based on the degradation information.

4. The storage battery device according to claim 3, further comprising a storage unit that transfers power utilizing the storage battery cell selected by the selection unit to store the transferred power,
wherein the control unit switches, based on the degradation information, the storage battery cell to be selected by the selection unit so that from among the plurality of storage battery cells, power can be supplied from a first storage battery cell to the storage unit and thereby the power can be supplied from the storage unit to a second storage battery cell in which capacity degradation is smaller than that in the first storage battery cell.

5. The storage battery device according to claim 3, wherein the storage battery cell is a lithium ion storage battery cell.

6. The storage battery device according to claim 2, further comprising a storage unit that transfers power utilizing the storage battery cell selected by the selection unit to store the transferred power,
wherein the control unit switches, based on the degradation information, the storage battery cell to be selected by the selection unit so that from among the plurality of storage battery cells, power can be supplied from a first storage battery cell to the storage unit and thereby the power can be supplied from the storage unit to a second storage battery cell in which capacity degradation is smaller than that in the first storage battery cell.

7. The storage battery device according to claim 6, wherein the storage battery cell is a lithium ion storage battery cell.

8. The storage battery device according to claim 2, wherein the storage battery cell is a lithium ion storage battery cell.

9. The storage battery device according to claim 1, wherein:
a voltage when the power supply unit performs charging is a pulse voltage; and
the control unit adjusts a duty ratio of the pulse voltage based on the degradation information.

10. The storage battery device according to claim 9, wherein the control unit sets the duty ratio of the pulse voltage to a higher level when capacity degradation of the storage battery cell selected by the selection unit becomes smaller based on the degradation information.

11. The storage battery device according to claim 10, further comprising a storage unit that transfers power utilizing the storage battery cell selected by the selection unit to store the transferred power,
wherein the control unit switches, based on the degradation information, the storage battery cell to be selected by the selection unit so that from among the plurality of storage battery cells, power can be supplied from a first storage battery cell to the storage unit and thereby the power can be supplied from the storage unit to a second storage battery cell in which capacity degradation is smaller than that in the first storage battery cell.

12. The storage battery device according to claim 10, wherein the storage battery cell is a lithium ion storage battery cell.

13. The storage battery device according to claim 9, further comprising a storage unit that transfers power utilizing the storage battery cell selected by the selection unit to store the transferred power,
  wherein the control unit switches, based on the degradation information, the storage battery cell to be selected by the selection unit so that from among the plurality of storage battery cells, power can be supplied from a first storage battery cell to the storage unit and thereby the power can be supplied from the storage unit to a second storage battery cell in which capacity degradation is smaller than that in the first storage battery cell.

14. The storage battery device according to claim 9, wherein the storage battery cell is a lithium ion storage battery cell.

15. The storage battery device according to claim 1, further comprising a storage unit that transfers power with the storage battery cell selected by the selection unit to store the transferred power,
  wherein the control unit switches, based on the degradation information, the storage battery cell to be selected by the selection unit so that, from among the plurality of storage battery cells, power can be supplied from a first storage battery cell to the storage unit thereby the power can be supplied from the storage unit to a second storage battery cell in which capacity degradation is smaller than that in the first storage battery cell.

16. The storage battery device according to claim 15, wherein the storage unit includes one selected from among a capacitor, a storage battery cell and a storage battery.

17. The storage battery device according to claim 16, wherein the storage battery cell is a lithium ion storage battery cell.

18. The storage battery device according to claim 15, wherein the storage battery cell is a lithium ion storage battery cell.

19. The storage battery device according to claim 1, wherein the storage battery cell is a lithium ion storage battery cell.

20. A charging control method implemented in a storage battery device that includes a plurality of storage battery cells connected in series,
  the method comprising:
  measuring voltages of the plurality of storage battery cells via terminals associated with each storage battery, and obtaining degradation information indicating degraded states of the plurality of storage battery cells respectively based on the voltages;
  selecting, using associated pairs of switches, at least one storage battery cell from among the plurality of storage battery cells;
  supplying power to the at least one storage battery cell selected in the selection step to charge said at least one storage battery cell; and
  switching, based on the obtained degradation information, a storage battery cell to be selected, and adjusting the power supplied in the power supply step.

* * * * *